(12) United States Patent
Moore et al.

(10) Patent No.: US 11,307,029 B2
(45) Date of Patent: Apr. 19, 2022

(54) METHOD FOR ANALYZING THE SURFACE QUALITY OF COMPOSITE LAMINATES

(71) Applicant: THE BOEING COMPANY, Chicago, IL (US)

(72) Inventors: Jeron D. Moore, Lynnwood, WA (US); Michael K. Louie, Renton, WA (US); Luis A. Perla, Sammamish, WA (US); Gagandeep Saini, Snohomish, WA (US); Christopher W. Fay, Seattle, WA (US); Robert G. Meyer, Renton, WA (US)

(73) Assignee: THE BOEING COMPANY, Chicago, IL (US)

( * ) Notice: Subject to any disclaimer, the term of this patent is extended or adjusted under 35 U.S.C. 154(b) by 952 days.

(21) Appl. No.: 15/943,254

(22) Filed: Apr. 2, 2018

(65) Prior Publication Data
US 2019/0301860 A1   Oct. 3, 2019

(51) Int. Cl.
| | |
|---|---|
| *G01B 21/00* | (2006.01) |
| *B29C 70/00* | (2006.01) |
| *B32B 27/00* | (2006.01) |
| *G01B 11/00* | (2006.01) |
| *G06F 30/00* | (2020.01) |
| *B29C 64/00* | (2017.01) |
| *G01B 21/30* | (2006.01) |
| *B29C 70/38* | (2006.01) |
| *B32B 27/26* | (2006.01) |

(Continued)

(52) U.S. Cl.
CPC ............ *G01B 21/30* (2013.01); *B29C 64/386* (2017.08); *B29C 66/90* (2013.01); *B29C 70/382* (2013.01); *B29C 70/54* (2013.01); *B32B 27/26* (2013.01); *G01B 11/24* (2013.01); *G06F 30/17* (2020.01); *G01N 2021/8472* (2013.01)

(58) Field of Classification Search
CPC ....... G01B 21/30; G01B 11/24; B29C 64/386; B29C 66/90; B29C 70/382; B29C 70/54; G06F 30/17; B32B 27/26; G05B 19/4097
See application file for complete search history.

(56) References Cited

U.S. PATENT DOCUMENTS

| | | |
|---|---|---|
| 2005/0047643 A1 | 3/2005 | Lowe |
| 2011/0017381 A1 | 1/2011 | Oldani |
| 2017/0212500 A1 | 7/2017 | Dostert et al. |

OTHER PUBLICATIONS

Extended European Search Report for Application No. 19164717.1 dated Sep. 12, 2019.

*Primary Examiner* — Linda L Gray
(74) *Attorney, Agent, or Firm* — Marshall, Gerstein & Borun LLP

(57) ABSTRACT

A method for analyzing a surface quality of a laminate part including the steps of creating a planned dimensioned representation of a laminate part desired to be built which includes a first surface having a first topography; placing fibers into locations for the laminate part desired to be built; and curing a resin associated with the placed fibers fabricating an as-built laminate part which includes a second surface having a second topography which corresponds to the first surface having the first topography. The method also includes aligning the first surface, the second surface and the locations of the fibers; determining a first elevation of a first point on the first surface and a second elevation of a second point on the second surface; and observing the first surface, the second surface and the locations of the fibers in alignment and the first elevation relative to the second elevation in analyzing the surface quality of the laminate part.

20 Claims, 7 Drawing Sheets

(51) Int. Cl.
  *G01B 11/24* (2006.01)
  *B29C 70/54* (2006.01)
  *G06F 30/17* (2020.01)
  *B29C 64/386* (2017.01)
  *B29C 65/00* (2006.01)
  *G01N 21/84* (2006.01)

METHOD FOR ANALYZING THE SURFACE QUALITY OF COMPOSITE LAMINATES

FIELD

This disclosure relates to a method of analyzing the surface quality of a laminate part, and more particularly, identifying the location of a surface anomaly with respect to locations of fibers within the laminate part.

BACKGROUND

There are currently very limited tools for analyzing the surface quality of a composite laminate part which locate a surface anomaly as well as the internal fiber locations within the laminate part which contribute to surface anomalies. These tools include non-destructive inspection procedures and destructive inspection procedures.

Non-destructive inspection procedures can include use of the transmission of ultrasound or x-ray waves to internally scan the laminate part. This non-destructive inspection involves expensive equipment. The inspection can also require long lead times for analysis. The resolution for such non-destructive inspection is not always to a level so as to extract precise defects and their locations. These non-destructive inspections which utilize transmission of ultrasound or x-ray waves can also introduce systematic noise into the analysis by way of the inspection requires these wave transmissions to scan through layers of composite laminate material.

A destructive inspection procedure for a laminate part includes destruction of a coupon cutout of the part being inspected and requires high resolution scanning of cross sections of the laminate part. This procedure not only has the drawback of requiring the destruction of the part for the analysis but also has a further drawback in that the user is receiving a two dimensional ("2D") analysis of a single slice of the laminate part at a time. This analysis of a single slice at a time can be difficult to understand the anomaly which needs three dimensional ("3D") analysis.

Thus, there is a need to provide for a non-destructive inspection analysis which does not require excessive costs and time expended associated with the equipment, the inspection and the analysis. There is also a need to provide a high resolution inspection to provide precision in locating a defect or anomaly in the surface and fiber locations within the laminate part which are proximate to the anomaly, since the existence of the surface defect or anomaly can be as a result of the fiber locations positioned beneath the surface of the laminate part and within the vicinity of the anomaly. There is also a need to avoid the introduction of systematic noise which can be introduced by wave transmissions that may be used to internally scan a laminate part

SUMMARY

An example includes a method for analyzing a surface quality of a laminate part which includes the steps of creating a planned dimensioned representation of a laminate part desired to be built which includes a first surface having a first topography and placing fibers into locations for the laminate part desired to be built. The method further includes the step of curing a resin associated with the placed fibers fabricating an as-built laminate part from the planned dimensioned representation of the laminate part desired to be built which includes a second surface having a second topography which corresponds to the first surface having the first topography. Further included are the steps of aligning the first surface, the second surface and the locations of the fibers; determining a first elevation of a first point on the first surface and a second elevation of a second point on the second surface; and observing the first surface, the second surface and the locations of the fibers in alignment and the first elevation relative to the second elevation in analyzing the surface quality of the laminate part.

An example includes a computer-implemented method for analyzing a surface quality of a laminate part including the steps of receiving, by a processor, a data file which contains a planned dimensioned representation of a laminate part desired to be built which includes a first surface with first topographic data of the first surface and receiving, by a processor, a data file which contains locations of fibers for the laminate part desired to be built. The method further includes the step receiving, by a processor, a data file from a scan performed on a second surface having second topographic data, of an as-built laminate part fabricated from the planned dimensioned representation of the laminate part desired to be built, wherein the as-built laminate part was fabricated having fibers with fiber locations based on the data file which contains the locations of fibers for the laminate part desired to be built and the second surface corresponds to the first surface. The method further includes the step of aligning, by a processor, the first surface which includes first topographic data of the first surface from the data file which contains the planned dimensioned representation of the laminate part desired to be built; the second surface which includes second topographic data of the second surface from the data file which contains data from the scan performed on the second surface of the as-built laminate part; and the location of the fibers for the laminate part desired to be built from the data file which contains the locations of the fibers within the laminate part desired to be built. Further included is the step of determining, by a processor, a first elevation of a first point on the first surface and a second elevation of a second point on the second surface, wherein the first point is from the data file which contains the planned dimensioned representation of the laminate part desired to be built which includes the first surface with first topographic data and the second point is from the data file from the scan performed on the second surface having second topographic data of the second surface of the as-built laminate part. The method further includes the step of causing to be presented to a user via a display a visual representation representing the first surface, the second surface and the locations of fibers in alignment and an indication of the first elevation relative to the second elevation, in analyzing the surface quality of the laminate part.

The features, functions, and advantages that have been discussed can be achieved independently in various embodiments or may be combined in yet other embodiments further details of which can be seen with reference to the following description and drawings.

DESCRIPTION

Figure 1:
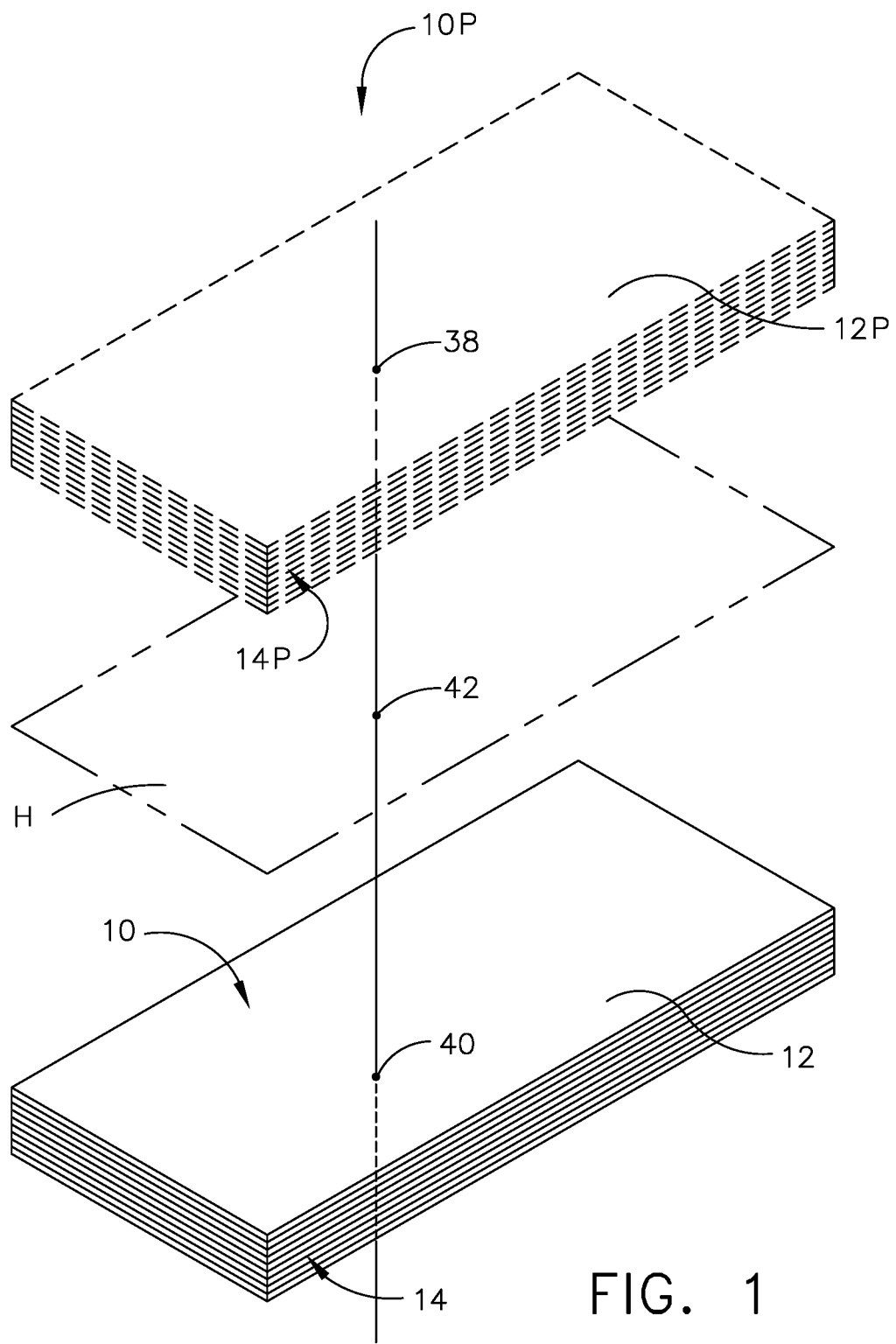
FIG. 1 is a schematic perspective view of a common horizontal plane of reference shown with a laminate part desired to be built positioned above the common horizontal plane and the as-built laminate part positioned below the common horizontal plane of reference.

Laminate parts can be made of one of numerous shapes and contours so as to accommodate an assembly to which the laminate part may be incorporated. In certain configurations of a laminate part, the designer may need to alter the position of fiber locations within plies of the laminate part to be built from a standard configuration of generally parallel spacing of fibers within a ply. This alteration of fiber locations from the standard configuration can include incorporating in locations an increased spacing between adjacent fibers within a ply of the laminate part to be built and/or include incorporating an overlap in locations of adjacent fibers within a ply of the laminate part to be built. As a result of the altering of fiber locations from the standard configuration with the laminate part to be built, the resulting fabricated as-built laminate part can result in having surface anomalies.

In the designing of a planned dimensioned representation of a laminate part desired to be built, the designer may, as mentioned above, need to alter locations of fibers within a ply which deviate from standard configuration of fibers which includes fibers spaced apart and extending generally parallel to one another within the ply. In some occurrences of altering locations of fibers, one ply may have an overlap of adjacent fibers within that ply which in turn aligns with an overlap of adjacent fibers within another ply. This alignment configuration of overlapping fibers can result in an anomaly of a protrusion being positioned on the surface of the as-built or cured laminate part. The protrusion would be a deviation from a surface of the planned dimensioned representation of the laminate part desired to be built. The elevation difference in the protrusion in the surface of the as-built laminate part with respect to the elevation of the surface of the planned dimensioned representation of the laminate part desired to be built may or may not be within a tolerance range that is acceptable for the intended use of the as-built laminate part. The tolerance range may take into account the need to provide an appropriate bonding surface or fit of the as-built laminate part with respect to another part within an assembly in which the as-built part is incorporated.

Similarly, plies which overlie one another within the laminate part to be built may have location(s) of adjacent fibers within a ply which are positioned at an increased spacing from the standard configuration of adjacent fibers and is aligned with an increased spacing of adjacent fibers from the standard configuration in another ply. The alignment configuration of these increased spacing of adjacent fibers in different plies can result in an anomaly of a recess being positioned on the surface of the fabricated as-built or cured laminate part. The elevation difference in the recess in the surface of the as-built laminate part that has been cured with respect to the elevation of the surface of the planned dimensioned representation of the laminate part desired to be built may or may not be within a tolerance range that is acceptable for the intended use of the as-built laminate part. The tolerance range may take into account the need to provide an appropriate bonding surface or fit of the as-built laminate part with respect to another part in an assembly in which the as-built part is incorporated.

As a result of an anomaly appearing in the surface of the as-built laminate part which deviates from the planned dimensioned representation of the laminate part desired to be built, an inexpensive and reliable analytical tool would be helpful in analyzing the fiber configuration locations within a laminate part and the surface anomalies that are associated with the particular fiber configurations. The analytical tool described herein can provide the developer or fabricator an inexpensive and reliable methodology, which does not introduce systematic noise, to identify an anomaly and to identify fiber locations that influence the anomaly. The analytical tool can provide the developer or fabricator the ability to alter locations of fibers within the laminate part to be built, if needed, to optimally bring an anomaly that may be in excess of a tolerance back within tolerance such that production of the laminate part serves its intended function.

In referring to FIG. 1, a dashed line format is used to show a planned dimensioned representation of the laminate part 10P (10-prime) desired to be built. Planned dimensioned representation of the laminate part 10P desired to be built is generally designed in advance of fabricating a corresponding as-built laminate part 10 as seen in FIG. 1 represented in a solid line format. As used herein, reference 10 identifies an as-built laminate part while reference 10P identifies the desired "to be built" laminate part. In this example, planned dimensioned representation of the laminate part 10P desired to be built is placed within a computer aided design (CAD) file. The planned dimensioned representation of the laminate part 10P desired to be built sets forth the planned dimensions of the laminate part 10P desired to be built and provides data with respect, for example, to a first topography of first surface 12P as well as topography information for other surfaces with respect to laminate part 10P desired to be built. In addition, in this example planned dimensioned representation of laminate part 10P also includes the number of and thickness of plies 14P. The planned dimensioned representation of laminate part 10P desired to be built provides the dimensions and ideal topographical data for surfaces of the as-built laminate part 10, as seen in FIG. 1. The planned dimensioned representation of the laminate part 10P desired to be built does not include any fibers and therefore there are no fiber locations within the planned dimensioned representation of the laminate part 10P desired to be built. As a result, the planned dimensioned representation of the laminate 10P desired to be built does not have any anomalies on any surface such as for example first surface 12P which in contrast otherwise can appear in second surface 12 of as-built laminate part 10 as a result of particular fiber locations being positioned within plies 14 of as-built laminate part 10 as discussed above.

In referring to FIG. 1, as-built laminate part 10 was constructed from the design of planned dimensioned representation of the laminate part 10P desired to be built along with the placement of fibers within locations of the laminate part 10P desired to be built. The planned representation of the laminate part 10P desired to be built, as mentioned above, does not include fibers. The locations of fibers which result in as-built laminate part 10, in this example, is provided to a numerical control (not shown) which directs the operation of an automated fiber placement machine (not shown) used in constructing as-built laminate part 10. With utilizing the planned dimensioned representation of the laminate part 10P desired to be built as seen in FIG. 1 in combination with placing fibers into locations for laminate part 10P desired to be built, this assembly is cured and as-built laminate part 10 is fabricated.

Figure 2:
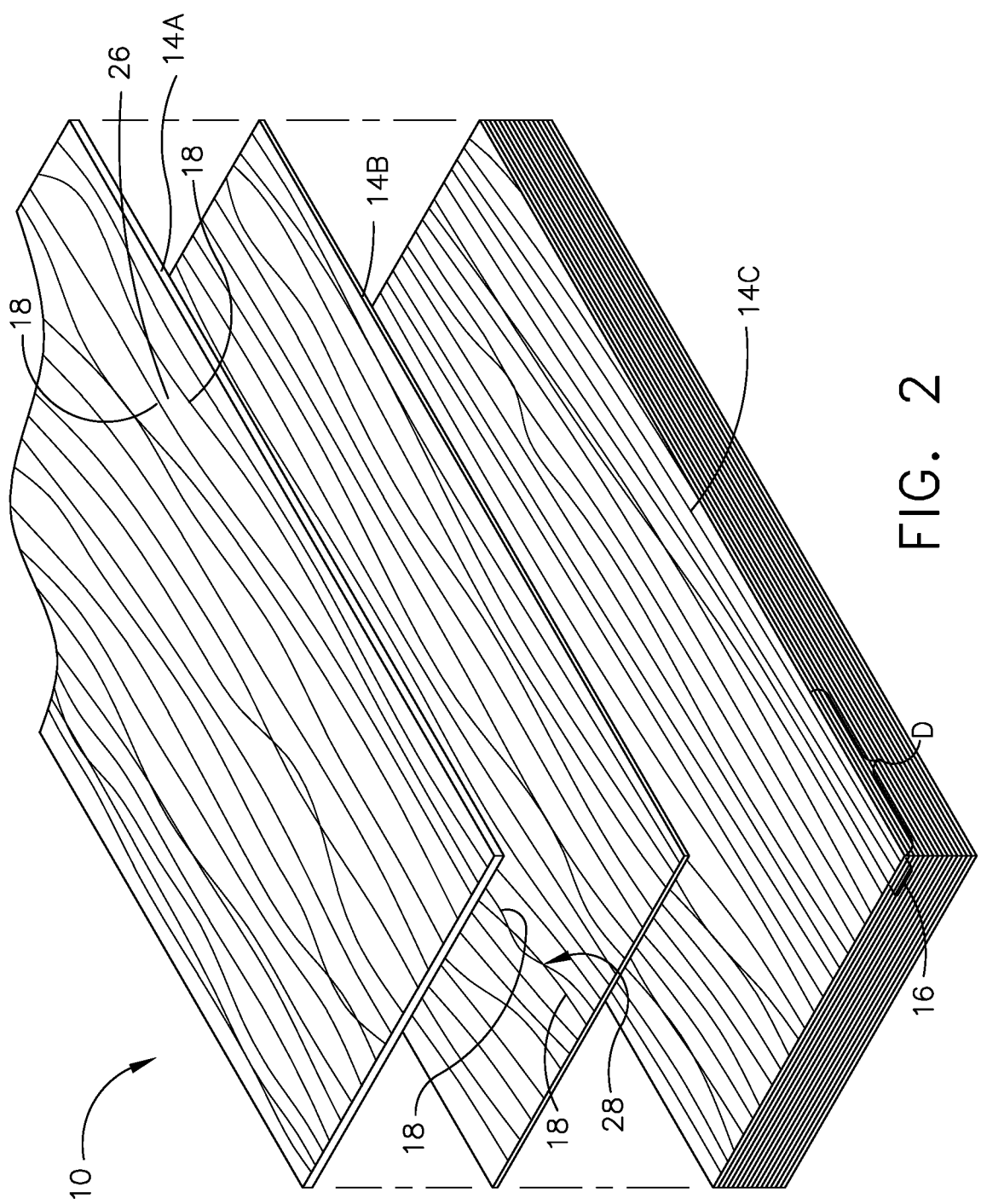
FIG. 2 is a partially exploded view of the as-built laminate part of FIG. 1 with locations of fibers positioned within separate plies of the laminate part.

In referring to FIG. 2, as-built laminate part 10 is shown with three plies 14A, 14B and 14C in an exploded perspective view. An exemplary standard configuration 16 of fibers 18 which extend along ply 14C a distance D is shown. Other fibers 18 which deviate from standard configuration 16 will be discussed in more detail below.

Figure 3:
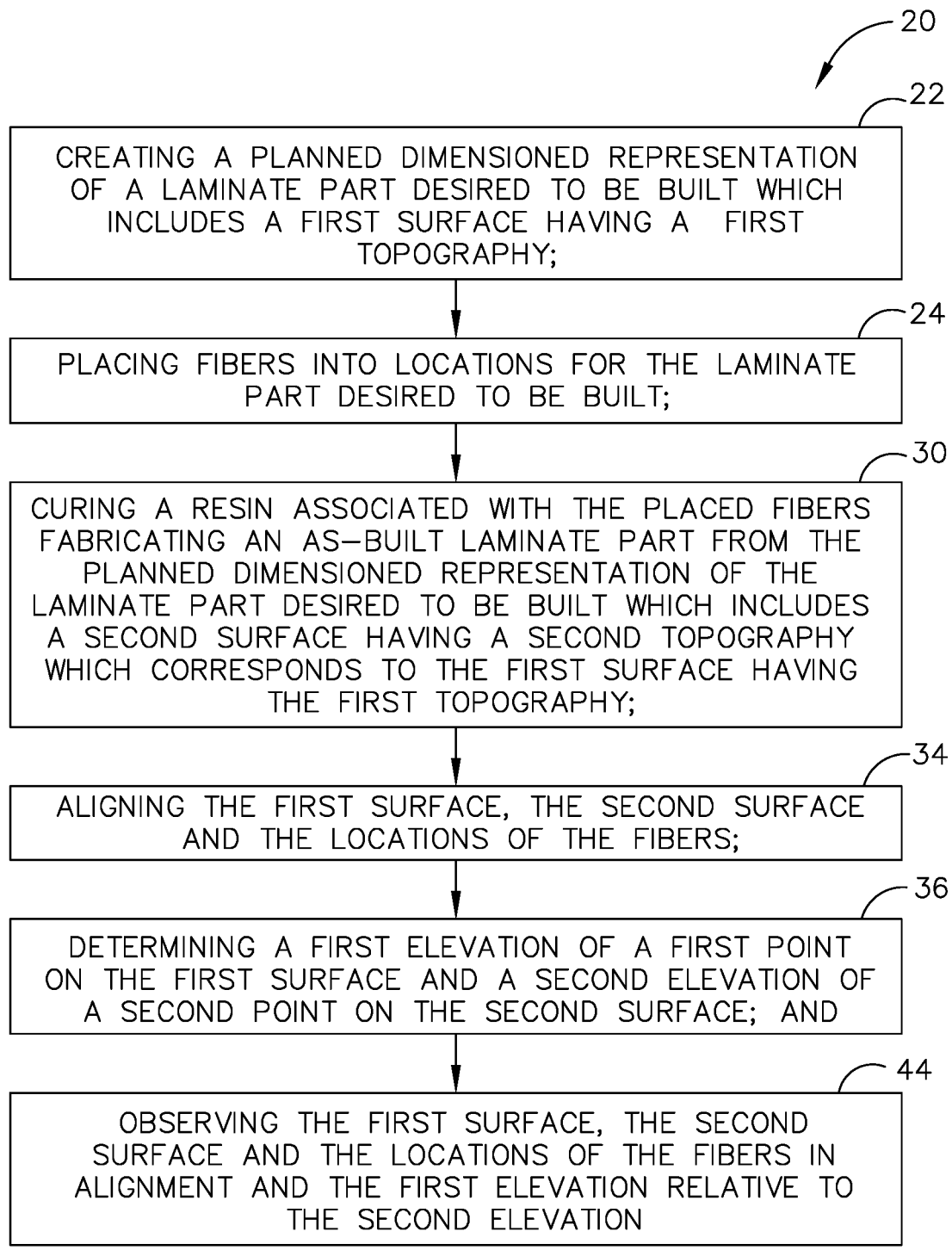
FIG. 3 is a flow chart of a method for analyzing composite laminate surface quality.

In referring to FIG. 3, a flow chart for method 20 for analyzing a surface quality of a laminate part is shown. Method 20 will be discussed below along with a computer-implemented embodiment of this method for analyzing the surface quality of a laminate part with respect to the schematic block diagram of a laminate part surface quality analyzing system 46 of FIG. 5. Analyzing a surface quality of a laminate part includes identifying and quantifying contour deviations within a surface of a fabricated laminate part in comparison to a corresponding surface of an ideal design for the laminate part. The analyzing includes identifying and ascertaining whether surface deviations on the fabricated laminate part, such as a recess or protrusion, is within an acceptable tolerance for the surface to be acceptable for optimally, for example, bonding the surface to a surface of another part. At the same time, the analysis provides identification of the location of fibers within the fabricated laminate part and within the vicinity of the surface deviation so as to provide an opportunity to ascertain adjustments being made to fiber locations for a subsequent fabrication of the part in order to mitigate the surface deviation and provide a surface within the acceptable tolerance of a subsequently fabricated laminate part.

In referring to FIG. 3, method 20 for analyzing a surface quality of a laminate part includes step 22 of creating a planned dimensioned representation of a laminate part 10P desired to be built which includes a first surface 12P having a first topography as shown in FIG. 1. As mentioned earlier the planned dimensioned representation of the laminate part 10P desired to be built which includes first surface 12P having first topography is placed in this example into a CAD file. Method 20 further includes step 24 of placing fibers into locations for laminate part 10P desired to be built. As also mentioned earlier, planned dimensioned representation of laminate part 10P desired to be built does not include fibers does have dimensions and contour configurations that are ideal for the ultimately fabricated as-built laminate part 10. Step 24 further includes placing the locations of the fibers within a numerical control (not shown) for controlling an automated fiber placement machine (not shown) for fabricating as-built laminate part 10. Thus in this example, a digital representation of the locations of the fibers is available as provided to the numerical control for the automated fiber placement machine used in constructing an as-built laminate part 10 as well as a digital representation of the planned dimensioned representation of the laminate part 10P desired to be built which includes first surface 12P and first topography of first surface 12P that has been provided to a CAD file.

Step 24 of placing of fibers into locations for the laminate part 10P desired to be built further includes in this example placing at least two adjacent fibers within at least one ply of the laminate part 10P desired to be built such that at least two adjacent fibers deviate from the standard configuration which are fibers spaced apart and extending generally parallel to one another within a ply. Examples of deviations from standard configuration 16 can be seen in FIG. 2 of as-built laminate part 10. Step 24 of placing of fibers into locations for laminate part 10P desired to be built further includes in this example an increased spacing 26 between the at least two adjacent fibers 18 of the at least one ply 14A from standard configuration 16 as seen in FIG. 2 of as-built laminate part 10. Step 24 of placing of fibers into locations for the laminate part 10P desired to be built further includes in this example an overlap of at least two adjacent fibers 18 of the at least one ply 14B as seen in FIG. 2 of as-built laminate part 10.

Figure 4:
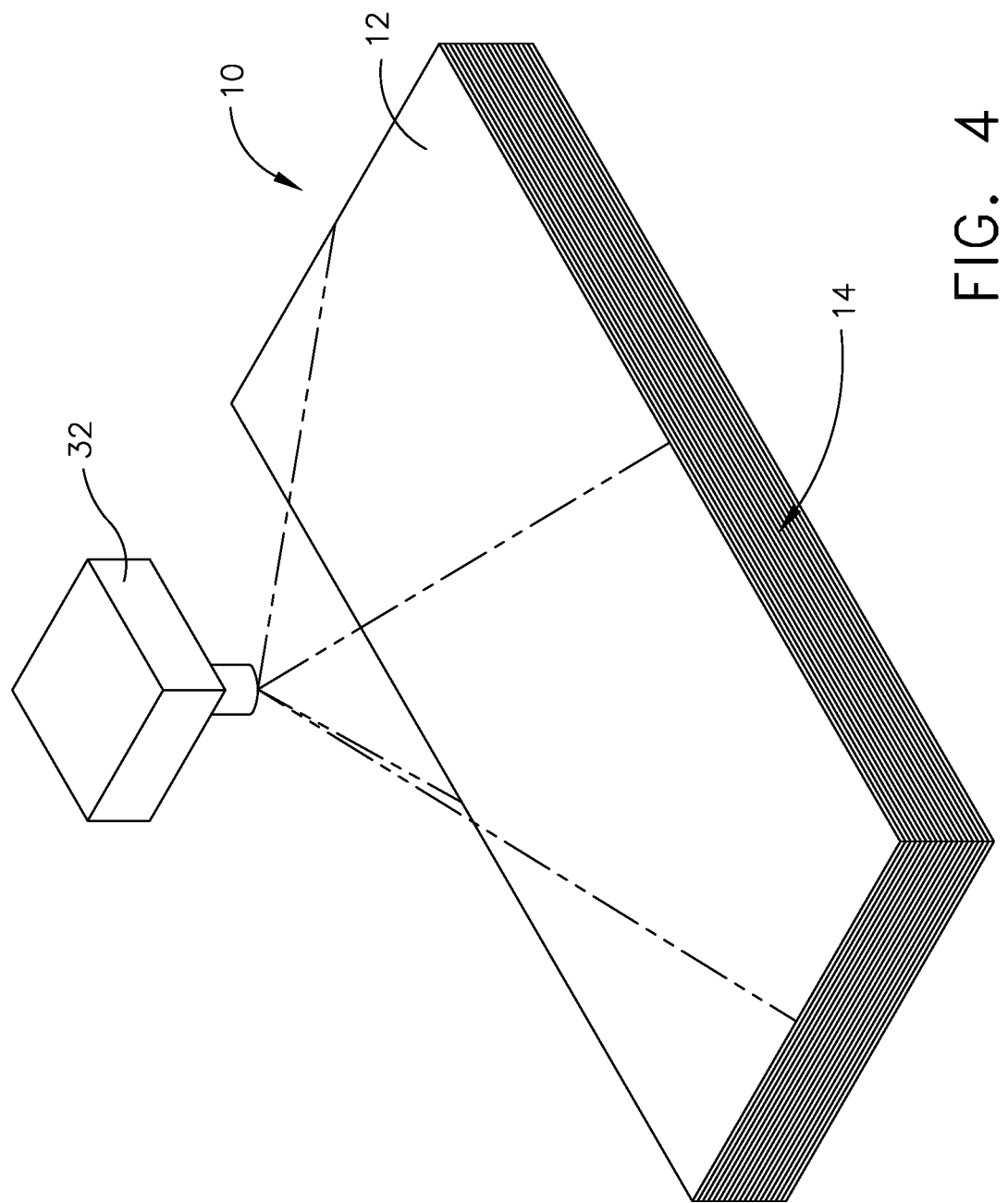
FIG. 4 is a schematic perspective view of scanning the second surface having a second topography of the as-built laminate part of FIG. 1.

In continuing to refer to FIG. 3, method 20 further includes step 30 of curing a resin associated with the placed fibers 18 fabricating an as-built laminate part 10 from the planned dimensioned representation of the laminate part 10P desired to be built which includes second surface 12 having a second topography as seen in FIG. 1, which corresponds to first surface 12P having first topography. As discussed earlier with as-built laminate part 10 having been cured with fibers positioned within as-built laminate part 10, anomalies or deviations can appear such as on second surface 12 which deviates from an ideal first surface 12P of the planned dimensioned representation of the laminate part 10P desired to be built. Step 30 of curing further includes scanning second surface 12, as shown in FIG. 4, to obtain the second topography of second surface 12. Scanning in this example is generally conducted with a laser scanner 32 which provides digital data of the second topography of second surface 12 which will be discussed below.

Method 20 for analyzing a surface quality of a laminate part of FIG. 3 further includes step 34 of aligning first surface 12P, second surface 12 and the locations of the fibers. This step 34 will be discussed in further detail below in the discussion of the computer-implemented method for analyzing the surface quality of a laminate part. As mentioned above digital data is available for first surface 12P and the topography of first surface 12P such as provided to CAD as well as a digital data representation of the locations of the fibers in various plies is available as was provided to the numerical control for the automated fiber placement machine used in constructing an as-built laminate part 10. Additionally, the scanning by laser scanner 32 provides digital data of the second surface 12 having second topography of second surface 12. This digital data will be used to align first surface 12P, second surface 12 and the locations of the fibers will be discussed in further detail below. Step 34 of aligning first surface 12P having the first topography from planned dimensioned representation of the laminate part 10P desired to be built; second surface 12 which has the second topography and the locations of the fibers includes: first surface 12P, second surface 12 and the locations of fibers all have a common horizontal plane H of reference (as seen for example positioned between laminate part 10P to be built and as-built laminate part 10 of FIG. 1) and a common vertical plane V of reference (not shown in FIG. 1 but would extend perpendicular in relationship to the common horizontal plane H of reference). With each of first surface 12P, second surface 12 and the locations of fibers having a common horizontal plane H of reference and a common vertical plane V of reference they are aligned such that comparisons between elevations on first surface 12P and second surface 12 can be easily made as well as determining the location of the fibers with respect to the elevation comparisons between first surface 12P and second surface 12. This will be further discussed herein and in the computer-implemented method.

Method 20 further includes step 36 of determining the first elevation of first point 38 on first surface 12P and the second elevation of second point 40 on second surface 12, as schematically identified in FIG. 1, wherein first and second points 38, 40 have a common point 42 of reference in common horizontal plane H of reference. With first surface 12P and second surface 12 aligned in the common horizontal plane H of reference and having the same common point 42 of reference, first point 38 and second point 40 are at the same location with respect to first surface 12P and second surface 12 respectively. Determining first elevation of first point 38 on first surface 12P and second elevation of second point 40 on second surface 12 includes in one example to position both planned representation of laminate part 10P desired to be built and as-built laminate part 10 aligned in the same position at a same common elevation in the common vertical plane V of reference. With both aligned in the same common elevation position relative to vertical plane V of reference, a measurement can be taken from the a common reference elevation on the vertical plane V of reference to first point 38 and provide a first elevation and a measurement can be taken from the common reference elevation on the vertical plane V of reference to second point 40 and provide a second elevation. The subtraction of first and second elevations will provide a difference in elevation between the first and second points 38, 40. So long as the difference in elevation, for example between first and second points 38, 40, is within a predetermined range for an acceptable tolerance, second point 40 on second surface 12 of as-built laminate part 10 can be used for optimally bonding to a surface of another part in fabricating an assembly to which as-built part 10 is incorporated. Should the difference in elevation fall outside the predetermined range for an acceptable tolerance, as-built laminate part will not be used in fabricating the assembly. Repositioning of fiber locations may be performed for mitigating the elevation difference so as to conform the surface of the laminate part to be within the acceptable tolerance for fabricating a subsequent laminate part.

Thus, if the measurements from the same common reference elevation are the same to first point 38 and to second point 40, there would be no difference in the measurements between first and second elevations thereby indicating there is no anomaly in existence at second point 40 of second surface 12 of as-built laminate part 10 relative to first point 38 of first surface 12P. If the measurement from the same common reference elevation to first point 38 establishing first elevation, on the other hand, is greater than the measurement from the same common reference elevation to second point 40 establishing second elevation, with the same common reference elevation of vertical plane V of reference positioned below both first point 38 and second point 40, this would indicate a recess anomaly at second point 40 on second surface 12 of as-built laminate part 10 relative to first point 38 of first surface 12P. Should the measurement from the same common reference elevation to first point 38 establishing first elevation be less than the measurement from the same common reference elevation to second point 40 establishing second elevation of second point 40, with the same common reference elevation of vertical plane V of reference positioned below both the first point 38 and second point 40, this would indicate a protrusion anomaly at second point 40 on second surface 12 of as-built laminate part 10 relative to first point 38 of first surface 12P.

Method 20 further includes step 44 of observing first surface 12P, second surface 12 and the locations of the fibers in alignment and first elevation of first point 38 relative to second elevation of second point 40. This will be further discussed in the computer-implemented method to be discussed below wherein the alignment of first surface 12P, second surface 12 and the locations of the fibers can be digitally represented aligned on an output display device 64 using the above described digital data related to the first surface 12P, second surface 12 and the fiber locations. Also, the first elevation of first point 38 relative to the second elevation of second point 40 are also visually represented as will also be discussed. This observation will provide information of a location of an anomaly in as-built laminate part 12 as well as relative difference in height or depth of the anomaly or deviation with respect to first surface 12P at that location and in addition provide the locations of the fibers which represent the locations of the fibers in the as-built laminate part 10. Step 44 of observing further includes a step of altering location of at least one fiber for the laminate part 10P desired to be built in response to any difference in elevation observed between the first elevation and the second elevation which exceeds a tolerance range. A tolerance range is predetermined by the designer or fabricator so as to provide the proper bonding surface or fit for second surface 12 with respect to other part(s) of an assembly to which as-built laminate part 10 and second surface 12 will be incorporated. The altering of locations of fibers 18 can mitigate a recess or protrusion deviation that can be positioned on an as-built laminate part and provide the surface of a subsequent fabricated as-built laminate part to be within an acceptable tolerance and be optimal in bonding or fitting with respect to an assembly to which it may be incorporated.

Figure 5:
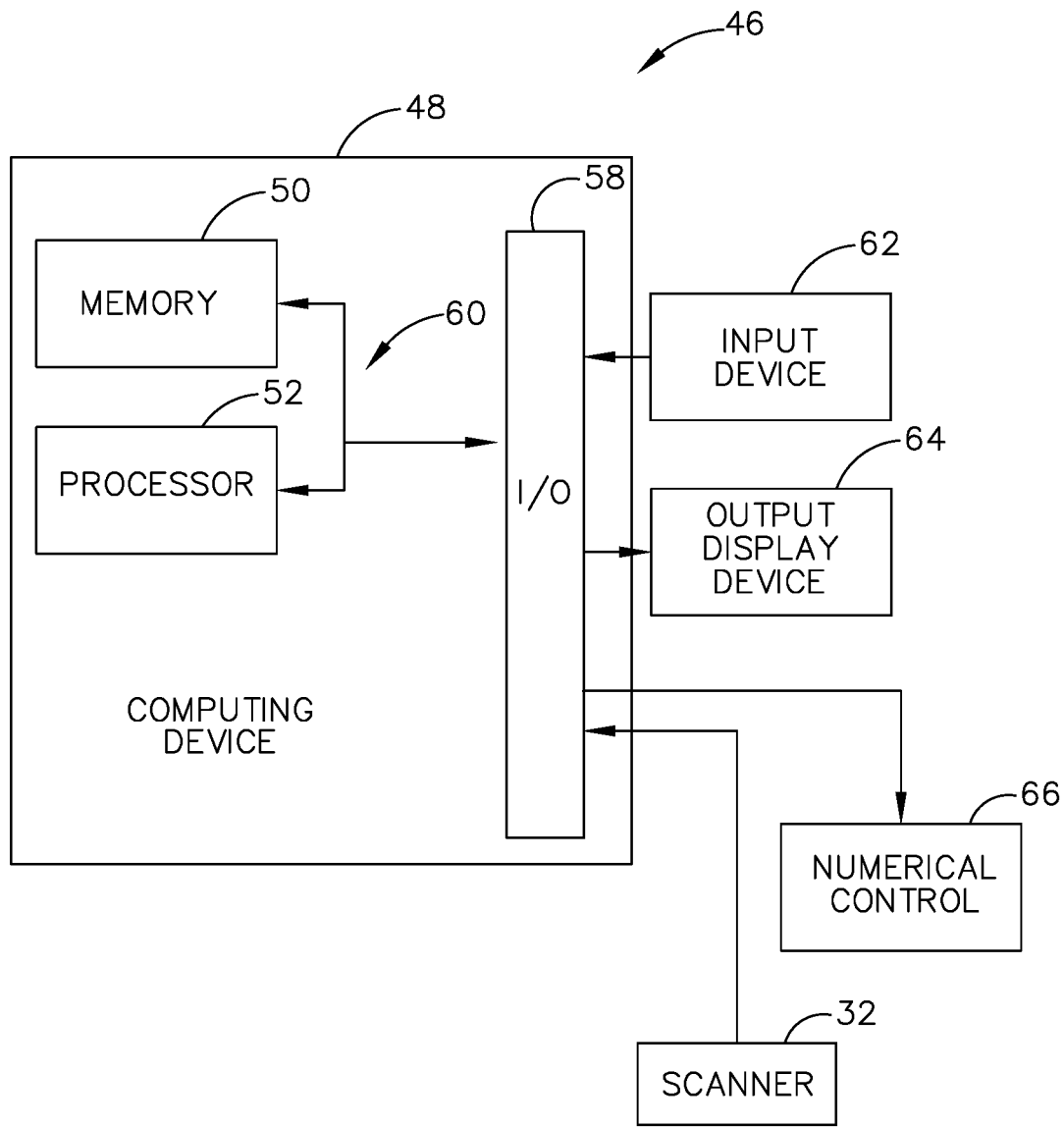
FIG. 5 is a schematic block diagram of a composite laminate surface quality analyzing system upon which methods described herein may operate.

A computer-implemented method for analyzing the surface quality of a laminate part will be operated for example utilizing a laminate part surface quality analyzing system 46, as shown in FIG. 5. System 46 includes computing device 48. Computing device 48 includes memory 50 and processor 52. Computing device 48 can take any one of a number of configurations and in this configuration computing device 48 includes memory 50 which includes storing non-transitory computer readable instructions in a tangible medium as well as temporary memory and processor 52 executes computer readable instructions. In this computing device 48 one or more microprocessors can be included. An I/O circuit 58, also in this computing device 48, is shown as one block but it should be appreciated I/O circuit 58 may include a number of different types of I/O circuits. Memory 50, processor 52 and I/O circuit 58 are all interconnected via an address/data bus 60. Further included within computing device 48 are input device 62 and output display device 64. In this example, input device 62 can include one or more keyboard(s), mouse(s) and/or touch screen(s) as well as other common input devices and output display device 64 can include one or more commonly known visual display devices. Both input device 62 and output display device 64 are connected in this example to I/O circuit 58.

Laminate part surface quality analyzing system 46 in this example further includes numerical control 66 which will receive data files of locations of fibers for laminate part 10P desired to be built, in this example from memory 50, wherein numerical control 66 will in turn be connected to an automated fiber placement machine (not shown) which will place fibers for plies 14 in fabricating as-built laminate part 10 in accordance with the data files received by numerical control 66. System 46, in this example, further includes scanner 32, which as earlier mentioned in this example, is a laser scanner which is utilized to scan as-built laminate part 10, as seen in FIG. 4, and provide topographic data of a surface, such as for second surface 12, to processor 52. This is one of many variations of system 46 which can be employed to run computer-implemented method for analyzing the surface quality of a laminate part.

Computer-implemented method for analyzing the surface quality of a laminate part can be operated on a laminate part surface quality analyzing system 46, such as described above wherein computer-implemented method includes the step of receiving, by processor 52, a data file which contains a planned dimensioned representation of a laminate part 10P desired to be built which includes first surface 12P with first topographic data of first surface 12P. This data file does not include fiber location data. In this example, the user can design planned dimension representation of a laminate part 10P desired to be built by way of inputting data from input device 62 to processor 52 in preparing a CAD file which is stored in memory 50. Further included is a step of receiving, by processor 52, a data file which contains locations of fibers for the laminate part 10P desired to be built. This data for data file in this example can have originated from input device 62 wherein the user designed the locations of fibers to be positioned in each ply for fabricating as-built laminate part 10. This data can, for example, be stored in memory 50 and available to be transmitted to numerical control 66 which instructs the automated fiber placement machine (not shown) to properly place fibers for each ply for laminate part 10P desired to be built for fabrication of as-built laminate part 10.

The computer-implemented method includes a step of receiving by processor 52 the data file which contains the locations of fibers within the laminate part desired to be built 10P further includes identifying the location of any deviation from a standard configuration between adjacent fibers, as mentioned earlier, positioned in each ply of the laminate part 10P desired to be built for fabrication of as-built laminate part 10. The data file further includes identifying the location of an increased spacing 26 from standard configuration 16 between two adjacent fibers 18 within at least one ply such as seen in ply 14A of FIG. 2. The data file further includes identifying a location of an overlap 28 of two adjacent fibers 18 within at least one ply such as seen in ply 14B as seen in FIG. 2.

Computer-implemented method further includes a step of receiving, by processor 52, a data file from a scan performed by scanner 32 which was performed on second surface 12 having second topographic data, of an as-built laminate part 10 fabricated from planned dimensioned representation of the laminate part 10P desired to be built. As-built laminated part 10 was fabricated having fibers with fiber locations based on the data file which contains the locations of fibers for the laminate part desired to be built 10P and second surface 12 corresponds to first surface 12P.

Computer-implemented method further includes a step of aligning, by processor 52, first surface 12P which includes first topographic data of first surface 12P from the data file which contains the planned dimensioned representation of the laminate part desired to be built 10P; second surface 12 which includes second topographic data of second surface 12 from the data file which contains data from the scan performed on second surface 12 of as-built laminate part 10; and the location of the fibers for laminate part desired to be built 10P from the data file which contains the locations of the fibers within the laminate part desired to be built 10P. The scan performed as discussed earlier includes performing the scan, in this example, with laser scanner 32 as shown in FIG. 4 and providing processor 52 with the data which can be stored in memory 50. The step of aligning further includes aligning first surface 12P, second surface 12 and the locations of the fibers within the laminate part 10P desired to be built with respect to a common horizontal plane H of reference, as shown for example in FIG. 1, and a common vertical plane V of reference (not shown). As discussed earlier a representative horizontal plane H of reference can be seen in FIG. 1 wherein first point 38 and second point 40 have a common point of reference 42 in common horizontal plane H of reference. Thus, first point 38 and second point 40 are the same location with respect to planned dimensioned representation of the laminate part desired to be built 10P and as-built laminate part 10, respectively. Common vertical plane V of reference is (not shown), is oriented perpendicular to horizontal plane H of reference. Common vertical plane V of reference is designated in direction of arrow designated as V in FIGS. 6 and 7 which extends perpendicular to common horizontal plane H of reference designated by the two arrows H. Planned representation of laminate part 10P to be built and as built laminate part 10 are aligned in the same common elevation in the common vertical plane V of reference.

Computer-implemented method further includes a step of determining, by processor 52, first elevation of first point 38 on first surface 12P and second elevation of second point 40 on second surface 12 as seen in FIG. 1. First point 38 is from the data file which contains planned dimensioned representation of the laminate part 10P desired to be built which includes first surface 12P with first topographic data. Second point 40 is from the data file from the scan performed on second surface 12 having second topographic data of second surface 12 of as-built laminate part 10. The step of determining includes the first and second points 38, 40 have a common point of reference 42 in common horizontal plane H of reference which reflects that first point 38 and second point 40 are in the same location with respect to the horizontal plane H of reference with respect to planned dimensioned representation of laminate part 10P to be built and as-built laminate part 10 respectively.

As described earlier, determining the first elevation of first point 38 on first surface 12P and the second elevation of second point 40 on second surface 12 includes in one example to position both representation of laminate part 10P desired to be built and as-built laminate part 10 aligned at a same common elevation in the common vertical plane V of reference. With both aligned in the same common elevation position relative to the vertical plane V of reference, a measurement can be taken from a common reference elevation on the vertical plane V of reference to first point 38 and provide a first elevation and a measurement can be taken from the common reference elevation on the vertical plane V of reference to the second point 40 and provide a second elevation. The subtraction of first and second elevations will provide a difference in elevation between the first and second points 38, 40. All of this can be computed by processor 52.

Thus, in one example, processor 52 can compute measurements from the same common reference elevation of common vertical plane V of reference and should those measurements be the same to first point 38 and to second point 40, there would be no difference in the measurements or between first and second elevations thereby indicating there is no deviation or anomaly in existence at second point 40 of second surface 12 of as-built laminate part 10 relative to first point 38 of first surface 12P. If the measurement computed from the same common reference elevation to first point 38 establishing first elevation, on the other hand, is greater than the measurement from the same common reference elevation to second point 40 establishing second elevation, with the same common reference elevation of vertical plane V of reference positioned below both the first point 38 and second point 40, this would indicate a recess anomaly at second point 40 on second surface 12 of as-built laminate part 10 relative to first point 38 of first surface 12P. Should the measurement from the same common reference elevation to first point 38 establishing first elevation be less than the measurement from the same common reference elevation to second point 40 establishing second elevation of second point 40, with the same common reference elevation of vertical plane V of reference positioned below both the first point 38 and second point 40, this would indicate a protrusion anomaly at second point 40 on second surface 12 of as-built laminate part 10 relative to first point 38 of first surface 12P.

Computer-implemented method further includes a step of causing to be presented to a user via a display 64 a visual representation which represents first surface 12P, second surface 12 and the locations of fibers in alignment and an indication of the first elevation relative to the second elevation. The locations of fibers are seen in output display device 64 in FIG. 6. The horizontal plane H of reference is shown by way of two arrows designated as H which extend perpendicular to one another and a vertical plane V of reference is designated by V which indicates an arrow which extends perpendicular relative to horizontal plane H. In this view, digital representations of locations of fibers for the laminate part 10P desired to be built which is fabricated as as-built laminate part 10 are shown positioned in various plies 14. This data would be data used to fabricate as-built laminate part 10 in utilizing numerical control 66 used to operate the automated fiber placement machine in the fabrication of as-built laminate part 10. The blank triangular forms 68 schematically represent the position of adjacent fibers 18 which are positioned in an increased spacing 26 as seen in FIG. 2 and the shaded triangular forms 70 schematically represent the position of adjacent fibers 18 in an overlap 28 position as also seen in FIG. 2. The view in display device 64 provides a representative view of the fiber locations within as-built laminate part 10.

Figure 6:
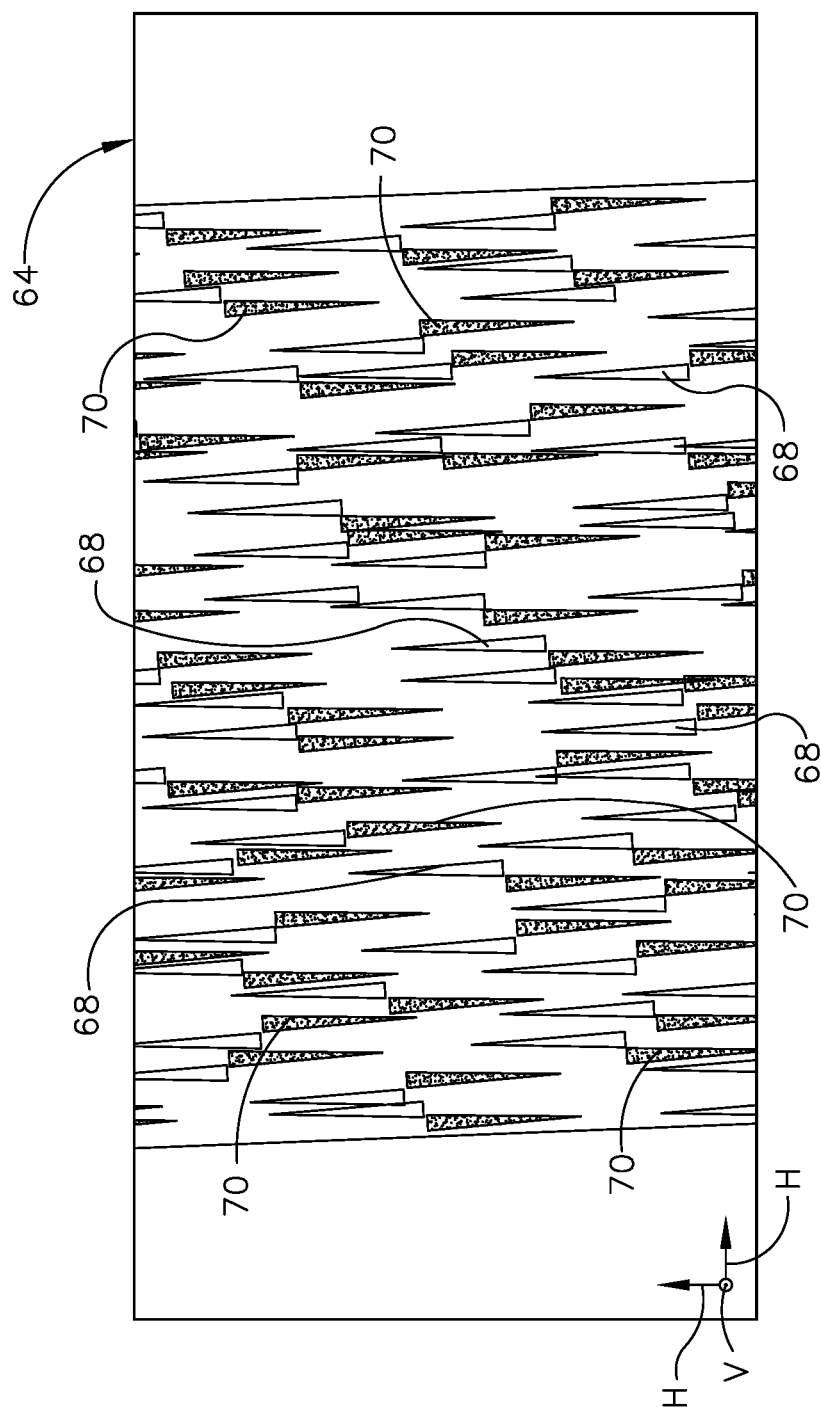
FIG. 6 is a plan schematic view of locations of the fibers for the laminate part desired to be built representative of the locations of fibers within the as-built laminate part of FIG. 2.
Figure 7:
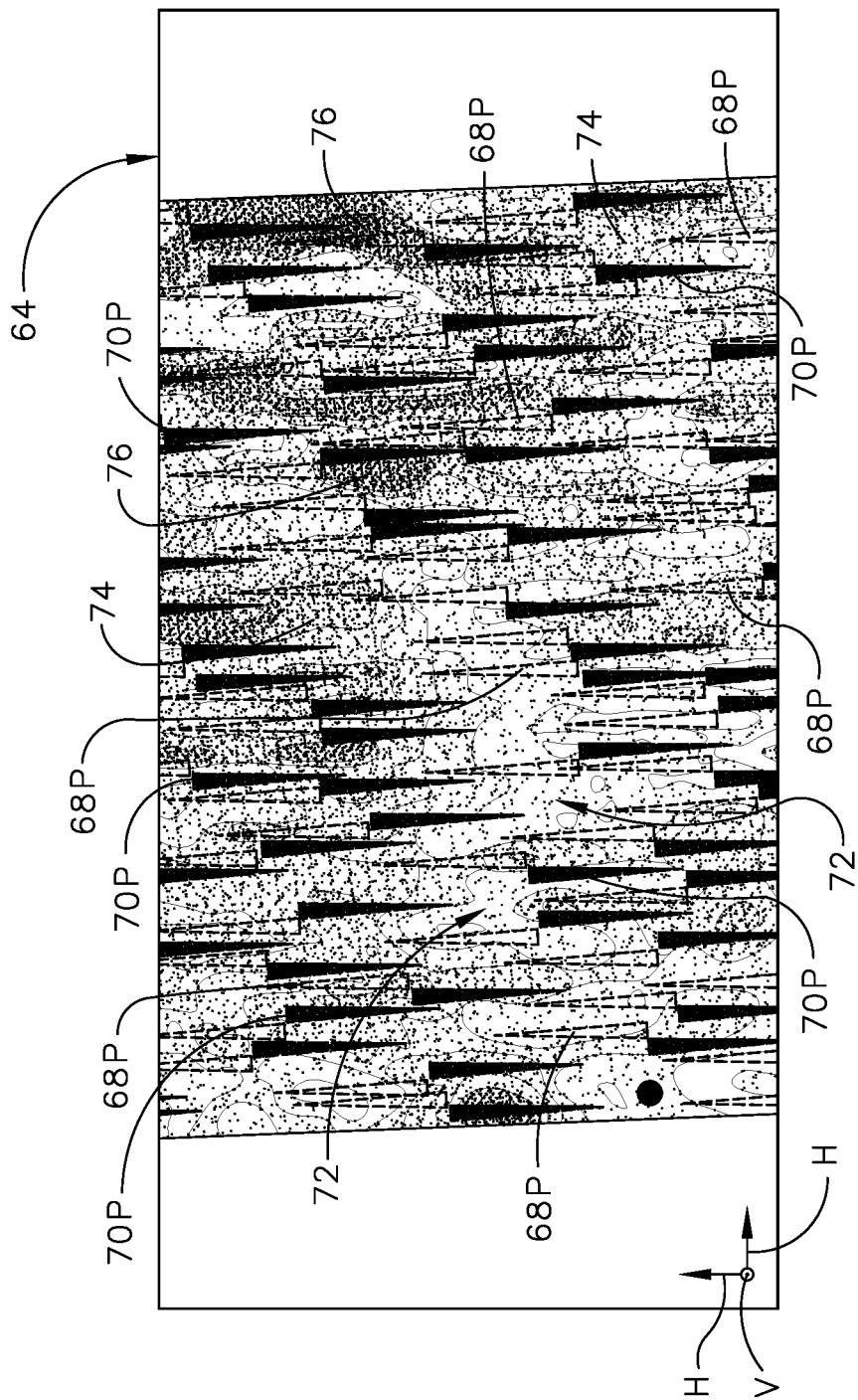
FIG. 7 is a plan schematic view of FIG. 6 wherein the locations of the fibers for the laminate part desired to be built, the first surface having the first topography of the planned dimensioned representation of the laminate part desired to be built and the second surface having the second topography of the as-built laminate part are all in alignment.

In referring to FIG. 7, locations of fibers 18 are shown as set forth for example in FIG. 6. However, in this view, the dashed triangular forms 68P schematically represent the position of adjacent fibers 18 which are positioned in an increased spacing 26 as seen in FIG. 2 and the solid triangular forms 70P schematically represent the position of adjacent fibers 18 in an overlap 28 position. With first surface 12P with topographic data for first surface 12P, second surface 12 with topographic data for second surface 12 and locations of fibers 18 in alignment in display 64 in FIG. 7 having a common horizontal plane H of reference and a common vertical plane V of reference. Display 64 also shows an indication of the first elevation relative to the second elevation which in this example ranges of differences of first and second elevations will be indicated by different shading or color coding wherein different colors designate predetermined range of difference in elevation between the first and second elevations.

As was determined for measuring or computing the first elevation and second elevation for first and second points 38 and 40 respectively, this can be done with numerous corresponding points on first surface 12P first topography and second surface 12 second topography. This would provide an indication of the differences between the first topography and the second topography of first and second surfaces 12P and 12 respectively. Predetermined ranges of differences in elevation, such as for example between first elevation and second elevation, can be indicated on display 64 by way of color coding or use of different colors such that a particular color will designate a predetermined range of difference in elevation between first elevation and second elevation. In this example, different grades of shading are provided instead of different colors indicating a different predetermined range of difference in elevation between for example first elevation and second elevation and for corresponding points such as first point 38 and second point 40. With a region of first surface 12P and second surface 12 having a difference in elevation of corresponding points in first surface 12P and second surface 12 that falls within a predetermined range, the color or the shading will be the same.

For example, region of shading 72 (or color) indicates a slight variation, or small range of difference in elevation between corresponding on first surface 12P of planned dimensioned representation of laminate part 10P desired to be built and second surface 12 of as-built laminate part 10 such as first point 38 and second point 40. In this example, the user will be indicated by the shading or coloring that there is no concern for anomalies in second surface 12 that are in this difference in elevation range between first surface 12P of laminate part 10P desired to be built and second surface 12 of as-built laminate part 10 such that any altering of locations of fibers is not needed and that region of shading 72 with respect to second surface 12 is acceptable for purposes of bonding and/or fit with other components within an assembly in which as-built laminate part is to be incorporated. The color coding or shading differences also provides the user the indication of the difference in elevation with respect to second surface 12 as to whether that region is in a recess position or protrusion position relative to first surface 12P.

Similarly, different shading 74 (or different color) which has slightly darker shading 74 than shading 72 (or of a different color) indicates a greater further variation in the difference first elevations of first point 38 of first surface 12P and that of second elevation of second point 40 of second surface 12 and such corresponding points between first surface 12P and second surface 12. This shading 74 also indicates there are no anomalies or deviations that need to be addressed in that region with respect to second surface 12 and therefore no changes in locations of fibers need to be made in that area. However, this region of different shading 74 (or coloring) is to be further reviewed should alterations of locations of fibers be made to check whether the tolerance becomes exceeded. As a result, the surface of as-built laminate part 10 in that region is acceptable for purposes of bonding and/or fit with other components within an assembly in which as-built laminate part 10 is to be incorporated.

Darker shading 76 (or a different color) which is a darker shading than shading 74 indicates a further variation in the difference of first point 38 first elevation of first surface 12P and that of second elevation of second point 40 of second surface 12 such that corresponding points and their first and second elevations in this region are outside of a predetermined acceptable tolerance range. As a result there is a surface anomaly or deviation associated with as-built laminate part 10 in that region of second surface 12. The user will need to look at the fiber locations and see what alterations of locations of fibers can be made so as to mitigate the anomaly or deviation on second surface 12 for a subsequent as-built laminate part is constructed. With the change in fiber locations being made, the user can go through the process of fabricating a subsequent as-built laminate part 10 and place this subsequent as-built laminate part 10 through the above analysis and check to see if the anomalies or deviations have been mitigated and are now within the acceptable tolerance such that as-built laminate part 10 is ready for production.

While various embodiments have been described above, this disclosure is not intended to be limited thereto. Variations can be made to the disclosed embodiments that are still within the scope of the appended claims.

What is claimed:

1. A method for analyzing a surface quality of a laminate part, comprising the steps of:
   creating a planned dimensioned representation of a laminate part to be built, wherein the planned dimensioned representation of the laminate part to be built includes a first surface having a first topography;
   placing fibers into locations for constructing the laminate part to be built as an as-built laminate part and adding a resin to the fibers;
   curing the resin added to the fibers to construct the as-built laminate part from the planned dimensioned representation of the laminate part to be built, wherein the as-built laminate part includes a second surface having a second topography which corresponds to the first surface of the laminate part to be built having the first topography, and wherein the step of curing further includes scanning the second surface to obtain the second topography of the second surface;
   aligning the first topography of the first surface, the second topography of the second surface, and the locations of the fibers of the planned dimensional representation of the as-built laminate part;
   determining a first elevation of a first point on the first surface and a second elevation of a second point on the second surface, wherein the first point and the second point have a same point of reference in a common horizontal plane of reference and wherein the planned dimensioned representation of the laminate part to be built, the as-built part, the first point, and the second point have a same common vertical plane of reference; and
   observing the first elevation relative to the second elevation.

2. The method of claim 1, wherein the step of placing fibers into locations for constructing the laminate part to be built includes placing the locations of the fibers within a numerical control for an automated fiber placement machine for fabricating the as-built laminate part.

3. The method of claim 1, wherein the step of placing of fibers into locations for constructing the laminate part to be built includes placing at least two adjacent fibers within a ply of the laminate part to be built such that the at least two adjacent fibers within the ply deviate from a standard configuration.

4. The method of claim 3, wherein the step of placing of fibers into locations for constructing the laminate part to be built includes an increased spacing from the standard configuration between the at least two adjacent fibers within the ply.

5. The method of claim 3, wherein the step of placing of fibers into locations for constructing the laminate part to be built includes an overlap of the at least two adjacent fibers within the ply.

6. The method of claim 1, wherein the step of creating the planned dimensioned representation of the laminate part to be built, which includes a first surface having a first topography, includes placing into a computer aided design file the planned dimensioned representation of the laminate part to be built.

7. The method of claim 1, wherein the step of creating the planned dimensioned representation of the laminate part to be built includes the planned dimensioned representation of the laminate part to be built does not include fibers.

8. The method of claim 1, wherein the step of determining further includes determining any difference in elevation between the first elevation and the second elevation.

9. The method of claim 8, wherein the step of observing further includes altering a location of at least one fiber for the laminate part to be built in response to a difference in elevation between the first elevation and the second elevation exceeding a tolerance range.

10. A computer-implemented method for analyzing a surface quality of a laminate part, comprising the steps of:
    receiving, by a processor of one or more processors, a data file which contains a planned dimensioned representation of a laminate part to be built, wherein the planned dimensioned representation of the laminate part to be built includes a first surface having a first topographic data of the first surface;
    receiving, by the processor of the one or more processors, a data file which contains locations of fibers for constructing the laminate part to be built as an as-built laminate part;
    receiving, by the processor of the one or more processors, a data file from a scan performed on a second surface having a second topographic data, of the as-built laminate part constructed from the planned dimensioned representation of the laminate part to be built, wherein:
       the as-built laminated part was fabricated having fibers with fiber locations based on the data file which contains the locations of fibers for the laminate part to be built; and
       the second surface has the second topographic data which corresponds to the first surface, having the first topographic data; and
    aligning, by a processor:
       the first surface which includes the first topographic data of the first surface from the data file which contains the planned dimensioned representation of the laminate part to be built;
       the second surface which includes the second topographic data of the second surface from the data file which contains data from the scan performed on the second surface of the as-built laminate part; and
       the location of the fibers for the laminate part to be built from the data file which contains the locations of the fibers within the laminate part to be built;
    determining, by a processor, a first elevation of a first point on the first surface and a second elevation of a second point on the second surface, wherein:
       the first point is from the data file which contains the planned dimensioned representation of the laminate part to be built which includes the first surface with first topographic data;
       the second point is from the data file from the scan performed on the second surface having the second topographic data of the second surface of the as-built laminate part; and
       the first point and the second point have a same point of reference in a common horizontal plane of reference and the planned dimensioned representation of the laminate part to be built, the as-built part, the first point, and the second point have a same common vertical plane of reference; and causing to be presented to a user via a display a visual representation, representing:

the first surface, the second surface, and the locations of the fibers in alignment; and an indication of the first elevation relative to the second elevation in analyzing the surface of the laminate part.

11. The method of claim 10, wherein the step of receiving by a processor the data file which contains the locations of fibers the laminate part to be built further includes placing the data file into a numerical control data file used for instructing an automated fiber placement machine to place fibers within the laminate part to be built.

12. The method of claim 10, wherein the step of receiving by a processor the data file which contains the locations of fibers within the laminate part to be built further identifies the location of any deviation from a standard configuration between two adjacent fibers positioned in a ply of the laminate part to be built.

13. The method of claim 12, wherein the step of receiving by a processor the data file which contains the locations of fibers within the laminate part to be built further includes identifying the location of an increased spacing from the standard configuration between at least two adjacent fibers within the ply.

14. The method of claim 12, wherein the step of receiving by a processor the data file which contains the locations of fiber within the laminate part to be built further includes identifying a location of an overlap of two adjacent fibers within the ply.

15. The method of claim 10, wherein the step of receiving by a processor a data file which contains the planned dimensioned representation of a laminate part to be built further includes the data file being a computer aided design file.

16. The method of claim 10, wherein the step of receiving by a processor a data file which contains the planned dimensioned representation of a laminate part to be built further includes receiving of the data file without containing fiber location data.

17. The method of claim 10, wherein the step of receiving by a processor the data file from the scan performed on a second surface further includes performing the scan with a laser scanner.

18. The method of claim 10, wherein the step of aligning includes aligning the first surface, the second surface and the locations of the fibers within the laminate part to be built with respect to the common horizontal plane of reference and a common vertical plane of reference.

19. The method of claim 10, wherein the step of causing to be presented to a user via a display further includes displaying a difference in elevation with respect to the first elevation and the second elevation using a color coding such that a color will designate a predetermined range of difference in elevation between the first elevation and the second elevation.

20. The method of claim 1, wherein the step of scanning the second surface includes use of a laser scanner.

* * * * *

UNITED STATES PATENT AND TRADEMARK OFFICE
CERTIFICATE OF CORRECTION

| | | |
|---|---|---|
| PATENT NO. | : 11,307,029 B2 | |
| APPLICATION NO. | : 15/943254 | |
| DATED | : April 19, 2022 | |
| INVENTOR(S) | : Jeron D. Moore et al. | |

It is certified that error appears in the above-identified patent and that said Letters Patent is hereby corrected as shown below:

In the Claims

At Column 13, Line 22, "an" should be -- the --.

At Column 13, Line 26, "the laminate" should be -- the as-built laminate --.

At Column 14, Line 42, "data; and" should be -- data; --.

At Column 16, Line 19, "part" should be -- part desired --.

Signed and Sealed this
Fifteenth Day of November, 2022

Katherine Kelly Vidal
*Director of the United States Patent and Trademark Office*